United States Patent
Malandrino et al.

(10) Patent No.: US 9,850,436 B2
(45) Date of Patent: Dec. 26, 2017

(54) METHOD FOR MAXIMIZING THE REACTION VOLUME IN A SLURRY PHASE REACTOR

(71) Applicant: ENI S.p.A., Rome (IT)

(72) Inventors: Alberto Maria Antonio Malandrino, Milan (IT); Vincenzo Piccolo, Zelo Buon Persico (IT)

(73) Assignee: ENI S.p.A., Rome (IT)

( * ) Notice: Subject to any disclaimer, the term of this patent is extended or adjusted under 35 U.S.C. 154(b) by 311 days.

(21) Appl. No.: 14/758,315

(22) PCT Filed: Jan. 22, 2014

(86) PCT No.: PCT/EP2014/051207
§ 371 (c)(1),
(2) Date: Jun. 29, 2015

(87) PCT Pub. No.: WO2014/114661
PCT Pub. Date: Jul. 31, 2014

(65) Prior Publication Data
US 2016/0012207 A1  Jan. 14, 2016

(30) Foreign Application Priority Data

Jan. 23, 2013 (IT) .............................. MI2013A0093

(51) Int. Cl.
*H01L 21/00* (2006.01)
*H01L 29/10* (2006.01)
(Continued)

(52) U.S. Cl.
CPC ............ *C10G 45/16* (2013.01); *B01J 8/1809* (2013.01); *B01J 8/22* (2013.01); *C10G 47/26* (2013.01);
(Continued)

(58) Field of Classification Search
CPC ................................................. H01L 21/67276
(Continued)

(56) References Cited

U.S. PATENT DOCUMENTS 5,922,191 A * 7/1999 Mata ...................... B01D 19/02
208/46
9,090,832 B2 * 7/2015 Heraud ...................... B01J 8/22
2/344

OTHER PUBLICATIONS

International Search Report and Written Opinion, dated Jun. 10, 2014, in PCT/EP2014/051207.
(Continued)

*Primary Examiner* — Calvin Lee
(74) *Attorney, Agent, or Firm* — Oblon, McClelland, Maier & Neustadt, L.L.P.

(57) ABSTRACT

Method for maximizing the reaction volume in a slurry phase reactor by determining the ratio (f) between the height of the foams ($H_f$) and the height of the reactor ($H_R$) through an algorithm defining the gas hold-up in three zones, a first lower zone in which a bubble regime is established, a second intermediate zone where there can be the presence of foams, a third zone situated in the upper hemispherical part in which the multiphase mixture is accelerated until it reaches outlet conditions, the average gas hold-up being given by the weighted average of each of the three gas hold-ups of the three zones, characterized in that it uses nuclear densimeters positioned inside the reactor at different heights and comprises: measuring, for each nuclear densimeter used, gas density values, relating to different gas and/or slurry velocities, which correspond through said algorithm to calculated gas hold-up values, revealing, with a calculated gas hold-up of less than 40%, the absence of foams at least up to the height at which the densimeter is positioned, whose density measured corresponds to said gas hold-up, with a calculated gas hold-up higher than 70%, the presence of foams starting
(Continued)

Figure 1:
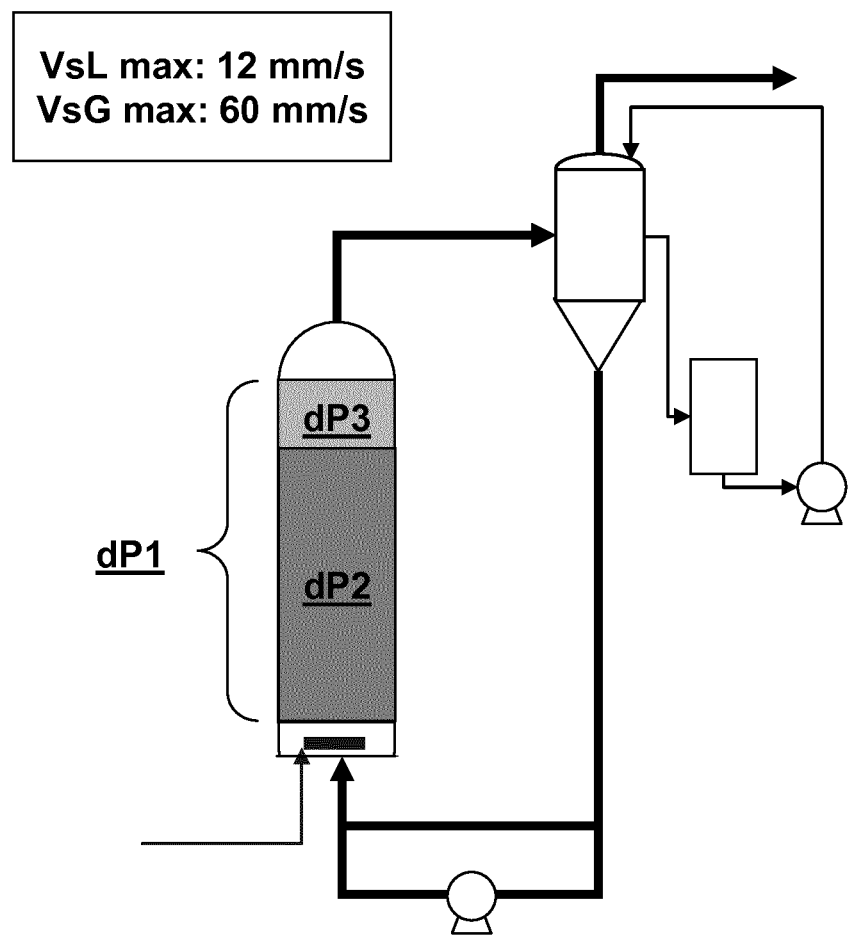

at least from the height of the reactor in which the densimeter is positioned, whose density measured corresponds to said gas hold-up, finally, determining through said algorithm, the ratio f and the extension in height of the possible presence of foams, calculating the consequent height $H_f$.

8 Claims, 2 Drawing Sheets

(51) Int. Cl.
    *C10G 45/16*     (2006.01)
    *H01L 21/67*     (2006.01)
    *B01J 8/18*     (2006.01)
    *B01J 8/22*     (2006.01)
    *C10G 47/26*     (2006.01)
    *C10G 49/12*     (2006.01)

(52) U.S. Cl.
    CPC ........ *C10G 49/12* (2013.01); *H01L 21/67276* (2013.01); *B01J 2208/00584* (2013.01); *B01J 2219/002* (2013.01); *B01J 2219/0025* (2013.01); *B01J 2219/00209* (2013.01); *B01J 2219/00243* (2013.01)

(58) Field of Classification Search
    USPC ........................................ 257/48; 438/14, 18
    See application file for complete search history.

(56) References Cited

OTHER PUBLICATIONS

K.A. Shollenberger et al., "Gamma-densitometry tomography of gas holdup spatial distribution in industrial-scale bubble columns", Chemical Engineering Science, PH: S0009-2509(97)00032-8, vol. 52, No. 13, 1997, XP055084375, pp. 2037-2048.

Jinwen Chen et al, "Gas holdup distributions in large-diameter bubble columns measured by computed tomography", Flow Measurement and Instrumentation, 9 ,1998, XP055083775, pp. 91-101.

Mohammad Fadhil Abid et al, "Hydrodynamic Characteristics Effect of Foam Control in Multiphase Column", May 23, 2011, XP55074272, 19 pages (with English translation), www.uotechnology.edu.iq/dep-chem-eng/PAPERS/mohamed%20fade1%20%20x.pdf.

Dragomir B. Bukur et al, "Hydrodynamic Studies with Foaming and Non-Newtonian Solutions in Bubble Columns", The Canadian Journal of Chemical Engineering, vol. 67., XP55084192, Oct. 1989, pp. 741-751.

L. Z. Pino et al., "Effect of Operating Conditions on Gas Holdup in Slurry Bubble Columns With a Foaming Liquid", Chemical Engineering Communications, 1992, vol. 117, No. 1, XP008164002, pp. 367-382.

J. Guitián et al., "How Bubbly Mixtures Foam and Foam Control Using a Fluidized Bed", Int. J. Multiphase Flow vol. 24, No. 1, PII: S0301-9322(97)00037-2, XP55074173, Feb. 1998, pp. 1-16.

* cited by examiner

METHOD FOR MAXIMIZING THE REACTION VOLUME IN A SLURRY PHASE REACTOR

The present invention relates to a method for maximizing the reaction volume in a slurry phase reactor, which, more specifically, envisages the positioning of nuclear densimeters in slurry bubble column (SBC) reactors at a high pressure and temperature, at defined heights, and the optimization of operating parameters through an algorithm on experimental data.

The invention allows to predict the extension of the low-density zone and the gas hold-up in the upper zone of a slurry reactor, preferably a hydrocracking slurry reactor. It is thus possible to minimize this zone and consequently maximize the reaction volume.

Bubble columns for the hydrocracking of heavy residues, with a single outlet for slurry and gas, can have a much higher gas hold-up in the upper zone (70-90%) than that in the lower part of the column (10-40%), due to the formation of a foamy phase. The presence of the high gas hold-up zone reduces the volume of slurry contained in the reactor and consequently negatively influences its specific conversion capacity.

Without any predictive instruments, the presence or absence of a low-density phase in the upper part of the reactor is generally deduced only from an analysis of the pressure profile along the axis of the reactor: if this profile has an approximately constant slope, then the density in the reactor is more or less constant; if, on the other hand, this profile reveals a change in the slope, this means that there has been a change in density, presumably due to the presence of a foamy phase.

The use of the pressure profile technique, however, requires that pressure meters be installed with a certain frequency along the axis of the reactor. This measurement, moreover, only provides information "a posteriori", i.e. when the phenomenon has already taken place. It is therefore important to predict the operative conditions which cause the presence of foams. It is consequently appropriate to avail of a method that is able to define the operative conditions which minimize the extension of the low-efficiency conversion zone.

It is known in literature (Guitian J., Joseph D., "How Bubbly Mixture Foam and Foam Control Using a Fluidized Bed", Int. J. Multiphase Flow, Vol. 24, N. 1, pages 1-16, 1998) that the operative parameters which regulate the appearance of this phase are the superficial velocity of the gas and slurry. For a certain velocity of the slurry, there is a critical velocity of the gas, above which there is the formation of foams. By reducing the value of the slurry velocity, the critical velocity of the gas is also reduced.

The presence of a foamy phase can be undesirable not only because it reduces the useful volume for the purposes of the reaction, but also because this phase is transferred to the transfer line (from the reactor to the separator) and to the separator, and here, it can create difficulties in the gas/liquid separation.

A method has now been found, which allows the gas hold-up to be predicted in relation to the experimental conditions (gas and liquid flow-rate, density of the gas and slurry, etc.) and also allows the fluid-dynamic functioning regime to be verified, enabling the user to avoid undesired conditions (presence of foams) and maximize the reaction volume available, which is based on mixture density measurements obtained with nuclear densimeters positioned inside the reactor at different heights and on the use of an algorithm which describes the gas hold-up inside a slurry bubble column.

This method can be applied to all reactors in slurry phase, preferably for conversion reactions of heavy residues to distillates or hydrogenation or hydrodesulfurization or hydrocracking, and in particular to slurry bubble columns.

The method, object of the present invention, for maximizing the reaction volume of a reactor in slurry phase by determining the ratio (f) between the height of the foams ($H_f$) and the height of the reactor ($H_R$) through an algorithm defining the gas hold-up in three zones, a first lower zone in which a bubble regime is established, a second intermediate zone where there can be the presence of foams, a third zone situated in the upper hemispherical part in which the multiphase mixture is accelerated until it reaches outlet conditions, the average gas hold-up being given by the weighted average of each of the three gas hold-ups of the three zones, is characterized in that it uses nuclear densimeters positioned inside the reactor at different heights and comprises:

measuring, for each nuclear densimeter used, gas density values, relating to different gas and/or slurry velocities, which correspond through said algorithm to calculated gas hold-up values, revealing, with a calculated gas hold-up of less than 40%, the absence of foams at least up to the height at which the densimeter is positioned, whose density measured corresponds to said gas hold-up, with a gas hold-up higher than 70%, the presence of foams starting at least from the height of the reactor in which the densimeter is positioned, whose density measured corresponds to said gas hold-up, finally, determining through said algorithm, the ratio f and the extension in height of the possible presence of foams, calculating the consequent height $H_f$.

The height ($H_R$) is the "tangent-to-tangent" height of the reactor, i.e. the height of the cylindrical part of the reactor.

There are preferably at least two nuclear densimeters used, more preferably at least three.

In the case of two nuclear densimeters used, they are preferably positioned at a height between H/4 and H/6 and between H/10 and H/5, H being the "tangent-to-tangent" height (line between the reactor and separator) of the reactor.

In the case of three nuclear densimeters used, they are preferably positioned at a height between H/4 and H/5, between H/9 and H/11 and between H/6 and H/7 of the reactor, H being the "tangent-to-tangent" height of the reactor.

In the case of at least two nuclear densimeters used, the parameters relating to the foams are established for the experimental reactive mixture with an optimization procedure which consists in varying the surface gas velocities so as to obtain readings on the upper densimeter of densities similar to those read on the lower densimeter or much lower, characteristic of the foamy phase.

The method allows the extension of the foamy zone and effective hold-up of the zone above the upper densimeter to be estimated, also when it is providing a bubbling phase reading.

The method, developed for a particular physico-chemical system, can be used for taking into account "foams" in the scale-up of the hydrocracking bubble columns of heavy residues.

The algorithm on which the method of the present invention is based, defines the gas hold-up in the three zones into which the slurry bubble column is considered as being divided: a first lower zone, which occupies most of the reactor, where a bubble regime is established; a second zone where, in relation to the operative conditions, the presence of foams may or may not occur; finally, a third zone, situated in the upper hemispherical part, where, due to a sectional reduction, the multiphase mixture undergoes an acceleration, which causes an increase in the gas hold-up until the limit value typical of the transfer line is reached (approximately equal to that corresponding to a zero relative velocity between gas and slurry). The average gas hold-up, which is useful for calculating the volume of liquid in the reactor, is given by the weighted average of each of the three contributions.

The relations/equations present in literature can be taken for the three zones.

In particular, as far as the lower zone is concerned, the data can be interpreted with the Krishna model with two bubble groups (Krishna, R., "A Scale-up Strategy for a Commercial Scale Bubble Column Slurry Reactor for Fischer-Tropsch Synthesis", Oil & Gas Science and Technology, Rev IFP, Vol. 55, N. 4, 359-393, 2000), whose parameters are the rise velocity of the small bubbles and the transition hold-up. The rise velocity $V_{\infty,om}$ of the small bubbles was estimated with the relation:

$$V_{\infty,om} = a \left[ \frac{\sigma(\rho_l - \rho_V)g}{\rho_l^2} \right]^{1/4} \exp(bH_f \varepsilon_f)$$

wherein $\sigma$ and $\rho_l$ are respectively the surface tension (expressed in N/m) and the density (expressed in kg/m$^3$) of the liquid phase inside the reactor, $\rho_V$ is the density (expressed in kg/m$^3$) of the vapour phase inside the reactor, $H_f$ and $\varepsilon_f$ are the height and hold-up of the possible foam phase present in the upper zone, and a and b are two parameters to be determined. In this expression, a slowdown effect was introduced due to the presence of foams: it was assumed, in fact, that the presence of foams in the upper zone of the reactor can cause a kind of barrier and therefore a slowdown in the rise velocity of the small bubbles and consequently an increase in the gas hold-up. The transition gas hold-up $\varepsilon_{tr}$ was estimated with the expression:

$$\varepsilon_{tr} = C \left[ \frac{\rho_V^{0.96} \sigma^{0.12}}{\rho_l} \right]^{1/2} (1 - C_1 f_V) \exp(-C_2 U_L)$$

wherein $f_V$ is the volumetric fraction of solid in the reactor, $U_L$ is the slurry velocity, C, $C_1$ and $C_2$ are three parameters to be determined.

The gas hold-up in the upper zone can be calculated taking into consideration that the reactor (having a height $H_R$) consists, up to a certain level $H_F$, of a zone characterized by a bubbling flow and an upper zone (as far as the tangent line) characterized by the presence of foams.

Depending on the flow conditions (slurry and gas flow-rates), a zone with a more or less constant density (about 180-200 kg/mc), is established in the upper part of the reactor, followed at the end, when the multiphase mixture enters the hemispherical zone, by a rapid decline towards the outlet conditions.

Once the multiphase mixture has entered the hemisphere, it undergoes an acceleration due to the sectional restriction, and consequently an increase in velocity: in this zone, the gas hold-up consequently will vary from the interface value (equal to that of the foam zone $\varepsilon_f$, if present, or that of the bubbling zone) to that at the outlet of the reactor from the hemispherical zone.

Considering that the slip velocity in this acceleration zone is kept constant and equal to the value at the upper tangent line, the gas hold-up profile in the hemisphere can be calculated, from geometrical considerations. As far as the foam phase (hold-up and position of the bubble/foam interface) is concerned, reference should be made to the description of Guitian and Joseph on the multiphase flow in slurry bubble columns with the simultaneous feeding of gas and slurry.

The gas hold-up in the foam phase can be obtained from the following expression:

$$\varepsilon_f = \frac{1}{1 + \Omega \frac{U_L}{U_G}}$$

wherein $\Omega$ is a slip parameter to be determined and $U_G$ is the gas velocity.

In order to obtain the interface position between bubble phase and foam phase, a procedure can be used, which requires a calculation of the dissipation energy due to the formation of foams: the ratio of the volumes of the foam and bubble phases is equal to the ratio between the energy dissipated in the foam and the energy dissipated in the bubbling mixture. By writing momentum and energy balances for the slurry and gas for the foam and bubbling phases, the following expressions are obtained for the power per unit of volume dissipated in the foam and the inlet power per unit of volume in the bubbling and foam phases (for details, see to the reference article):

$$D_f = \frac{3}{4} \frac{\rho_{sl} \varepsilon_f (1 - \varepsilon_f) C_D \left( \frac{U_G}{\varepsilon_f} - \frac{U_L}{1 - \varepsilon_f} \right)^3}{d_f}$$

$$I_B = g[(U_G + U_L)(\rho_V \varepsilon_B + \rho_{sl}(1 - \varepsilon_B)) - \rho_{sl} U_L - \rho_V U_G]$$

$$I_f = g[(U_G + U_L)(\rho_V \varepsilon_f + \rho_{sl}(1 - \varepsilon_f)) - \rho_{sl} U_L - \rho_V U_G]$$

The equation which allows the position of the bubble-foam interface to be determined, is therefore the following:

$$\frac{f}{1-f} = \frac{D_f f}{I_B(1-f) + I_f f - D_f f} \quad f = \frac{H_f}{H_R}$$

wherein f is the ratio between the height of the foams and the height of the reactor (0<f<1). If f is less than zero, this means that the conditions for the presence of foams are not present; if f>1, then the whole reactor is full of foams.

The present model presupposes that the two bubbling phases and foams can co-exist contemporaneously depending on the slurry and gas flow-rate (similarly to a thermodynamic equilibrium), positioning the lower interface at a height corresponding to the minimum of energy.

The application of the previous equations requires an estimation of the drag coefficient $C_D$ and diameter of the bubbles inside the foam phase $d_f$. With respect to the diameter of the bubbles inside the foam phase, Joseph indicates the following expression:

$$d_f = k\sqrt{\frac{U_G}{1-\varepsilon_f}}$$

The drag coefficient was correlated to the Reynolds number through the expression:

$$C_D = \left(0.63 + \frac{4.8}{Re^{1/2}}\right)^2$$

$$Re = \frac{d_f[\rho_v \varepsilon_f + \rho_{sl}(1-\varepsilon_f)]V_{slip}}{\mu_f}$$

$$V_{slip} = \frac{U_G}{\varepsilon_f} - \frac{U_L}{1-\varepsilon_f}$$

The parameter which is used for the fitting of the data of the upper zone is the viscosity of the foam which was considered a function of the slip velocity according to the formula:

$$\mu_f = \frac{c_1}{V_{slip}^{c_2}}$$

The parameters which allow the calibration of the model of foams are therefore the viscosity of the foam (which is assumed as being in relation to the relative velocity between gas and liquid) and the gas hold-up in the foams (function of the velocity ratio between the slurry and gas). The diameter of the bubbles inside the foam phase is also theoretically a parameter, but as there is not enough information for determining it and because diameter and the viscosity of the foam are linearly independent, one must be fixed and the other determined. It was therefore decided to fix said diameter so as to obtain dimensions in the order of millimeters.

As described above, the definition of the algorithm requires the determination of the parameters relating to the gas hold-up in the three zones.

If the slurry velocity is sufficiently high, than effecting a test, with a variation in the gas flow-rate, both of the densimeters should reveal a density corresponding to a gas hold-up typical of a bubble column (10-40%): consequently from an analysis of the gas velocity vs. gas hold-up curve, the parameters of the Krishna model (rise velocity of the small bubbles and transition gas hold-up, if the transition velocity is exceeded) can be obtained.

Once the algorithm relating to the bubble zone has been calibrated, the calibration of the parameters relating to the foams can be effected: for this purpose, a test is carried out with a sufficiently low velocity of the liquid. Under these conditions, with a variation in the gas flow-rate, there is a critical value of the gas velocity over which the densimeter situated halfway will continue to reveal high densities, whereas that situated above will begin to indicate much lower density values. This means that the upper zone of the reactor is no longer related to a bubbling regime, but a foamy regime, with a lower density.

The hold-up in the foams can be determined from an analysis of the density values read at the upper densimeter, in relation to the gas/slurry ratio. The viscosity of the foams, on the other hand, is varied until the middle position of the bubble/foam interfaces determined coincides with the position of the upper densimeter.

The gas hold-up of the zone situated in the upper hemispherical part may not necessarily be calculated, as the weighted average of the gas hold-up of said third zone can be considered negligible due to the volume of said third zone and due to a slip velocity equal to zero.

Two examples are provided, the first of which is comparative, for a better illustration of the invention.

EXAMPLE 1

Comparative

As a first application example of this solution, a case is described relating to a laboratory mock-up illustrated in FIG. 1.

The system is composed of a column having an internal diameter of 225 mm and a height of 2.41 m, a separator and a descending line in which the liquid circulates with a natural or forced circulation (by means of a pump). The column is equipped with a perforated ring distributor with 24 holes having a diameter of 1 mm. The column operates with nitrogen as gas and with water with the addition of a surfactant (SDS) as liquid phase: under these conditions, the presence of a low-density phase was verified in the upper zone of the column. The gas velocity was varied from 1 to 6 cm/s, whereas the velocity of the liquid from 0 to 12 mm/s. The gas hold-up in both the bubble zone and in the low-density zone was determined under each condition, together with the fraction of column occupied by foams.

Figure 2:
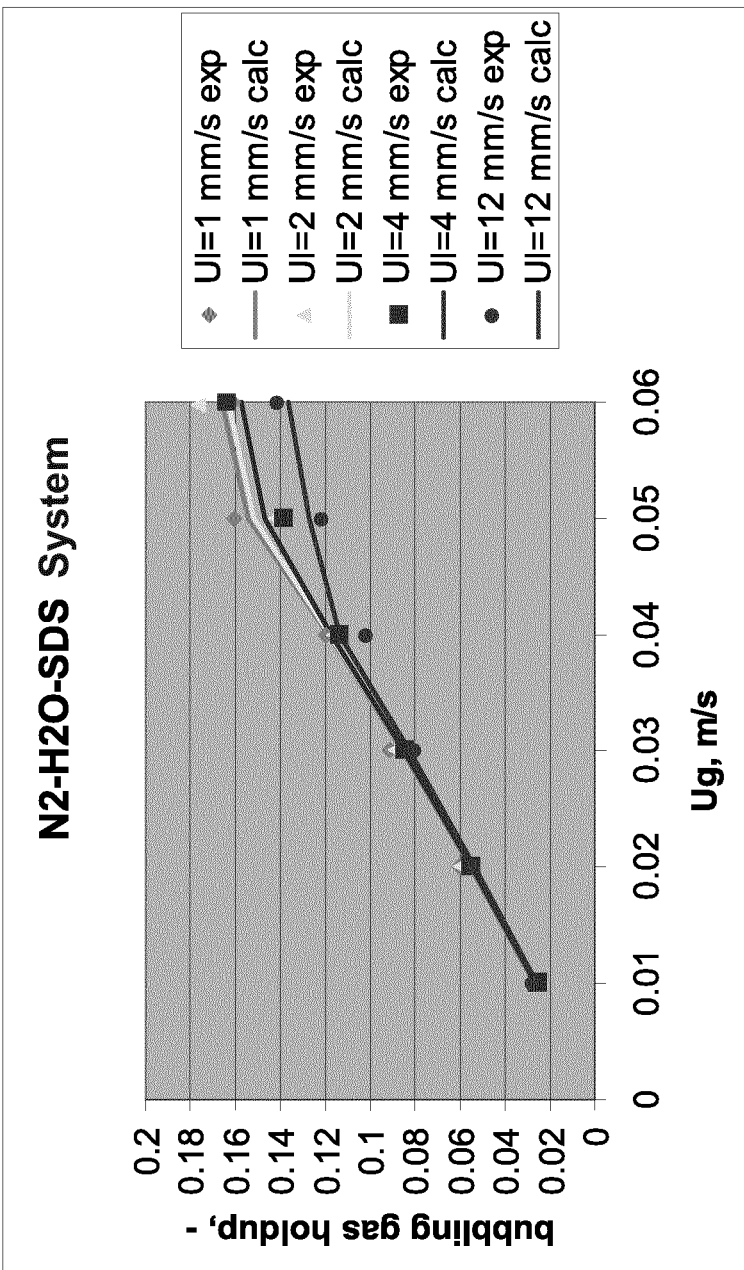

FIG. 2 shows the gas hold-up trends in the bubble zone in relation to the gas and liquid velocities.

This system shows the formation of a zone of foams in the upper part of the column for a gas velocity greater than 4 cm/s when $U_L$=1 mm/s, for a gas velocity greater than 5 cm/s when $U_L$=2 mm/s, and for a gas velocity of 6 cm/s when $U_L$=4 mm/s; the presence of foams is not revealed, on the contrary for $U_L$=12 mm/s.

For this system, the rise velocity of the small bubbles is 38.1 cm/s. The value of the constant "a" is 2.56. In this case, a slowdown effect of the small bubbles due to the presence of foams was not observed.

As far as the transition hold-up is concerned, the constants C, $C_1$ and $C_2$ are respectively equal to 5.5, 0 and 26.

The parameters relating to the model of foams for this system are indicated in the following table:

| | |
|---|---|
| Ω | 7 |
| k | 0.008 |
| $c_1$, Pa s | 0.0004 |
| $c_2$ | 2.07 |

With these parameters, the heights of foams predicted by the model compared with the experimental data are the following:

| Ug, cm/s | Ul, mm/s | $H_f$ calc, m | $H_f$ exp, m |
|---|---|---|---|
| 4 | 1 | 0 | 0.18 |
| 5 | 1 | 0.37 | 0.41 |
| 6 | 1 | 1.24 | 0.56 |
| 5 | 2 | 0 | 0.13 |
| 6 | 2 | 0.24 | 0.30 |
| 6 | 4 | 0 | 0.11 |

This example shows how, from an analysis of the data obtained from pressure measurements and from visual measurements of foam heights, it was possible to calibrate the parameters of the procedure, object of the invention.

EXAMPLE 2

This example relates to the calibration of the procedure from data deriving from a plant under reaction conditions, where it was consequently not possible to have visual measurements of the position of the possible foamy phase, but only density measurements through the presence of 3 nuclear densimeters, the first situated below, the second halfway and the third approximately a meter from the upper tangent line.

The data used can be summarized in the following table:

| Point | Ug, cm/s | Ul, mm/s | $\epsilon_{bav}$, % | $\epsilon_{sup}$, % |
|---|---|---|---|---|
| 1 | 2.70 | 0.66 | 32.1 | 78.1 |
| 2 | 2.06 | 0.70 | 32.7 | 60.9 |
| 3 | 1.66 | 0.54 | 32.0 | 66.6 |
| 4 | 2.00 | 0.85 | 25.3 | 27.9 |
| 5 | 1.97 | 0.80 | 24.2 | 24.6 |
| 6 | 2.00 | 0.84 | 25.4 | 32.3 |
| 7 | 1.96 | 0.88 | 24.1 | 27.1 |
| 8 | 2.11 | 0.81 | 23.9 | 28.2 |

As can be clearly seen from the table, points 1, 2 and 3 are characterized by hold-up values read at the upper densimeter typical of a foam phase: this means that under those conditions, the foam phase extended for at least a meter below the upper tangent line.

As far as the gas hold-up parameters in bubble phase are concerned, the parameters a and b are equal to 1.0 and 0.135; C, $C_1$ and $C_2$, on the other hand, are equal to 3.0, 6.2 and 26.4. The fact that the parameter b is different from zero means that under these conditions, an effect of the presence of foams was also revealed on the hold-up of the bubbling zone.

Upon analyzing the data relating to the foam zone and coupling them with those relating to the bubbling zone, the following parameters are obtained:

| | |
|---|---|
| $\Omega$ | 7.5 |
| k | 0.006 |
| $c_1$, Pa s | 0.06 |
| $c_2$ | 0 |

The following table indicates the main results of the model relating to the upper zone of the reactor:

| Point | Ug, cm/s | Ul, mm/s | $H_{foam}$, m | $\epsilon_f$, % |
|---|---|---|---|---|
| 1 | 2.70 | 0.66 | 3.6 | 84.5 |
| 2 | 2.06 | 0.70 | 0.0 | 79.7 |
| 3 | 1.66 | 0.54 | 2.5 | 80.3 |
| 4 | 2.00 | 0.85 | — | — |
| 5 | 1.97 | 0.80 | — | — |
| 6 | 2.00 | 0.84 | — | — |
| 7 | 1.96 | 0.88 | — | — |
| 8 | 2.11 | 0.81 | — | — |

Once the solution had been calibrated from the experimental data provided by the measurements of the densimeters, it consequently allowed not only the gas hold-up values to be determined in the bubbling zone and foam zone, but also the extension of the foam zone: this kind of information can in no way be obtained with conventional methods.

The invention claimed is:

1. A method for maximizing a reaction volume in a slurry phase reactor by determining a ratio (f) between a height of foams ($H_f$) and a height of the slurry phase reactor ($H_R$) through an algorithm to obtain gas hold-ups in three zones of the slurry phase reactor,
   wherein, in a first lower zone, a bubble regime is established,
   in a second intermediate zone, foams are optionally present, and
   in a third zone situated in an upper hemispherical part, a multiphase mixture is accelerated until it reaches an outlet, and
   wherein an average gas hold-up is obtained by a weighted average of each of three gas hold-ups of the three zones,
   wherein the slurry phase reactor comprises nuclear densimeters positioned inside the slurry phase reactor at different heights and the method comprises:
   measuring, gas density values at different gas and/or slurry velocities for each nuclear densimeter, to calculate gas hold-up values through the algorithm,
   identifying an absence of foams at least up to a height at which the nuclear densimeter is positioned, whose density measured corresponds to said gas hold-up, as determined by the gas hold-up value being less than 40%, or
   identifying a presence of foams starting at least from the height of the slurry phase reactor in which the nuclear densimeter is positioned, whose density measured corresponds to said gas hold-up, as determined by the gas hold-up value being higher than 70%, and
   finally, determining through said algorithm, the ratio f and a range of a height in which the foams are possibly present to calculate the foams height $H_f$.

2. The method according to claim 1, wherein a formula for calculating the gas hold-up of the first lower zone is the model of Krishna with two bubble groups, whose parameters are a rise velocity of the bubbles and a transition hold-up,
   the rise velocity $V_{\infty,om}$ of the bubbles being $$V_{\infty,om} = a\left[\frac{\sigma(\rho_l - \rho_V)g}{\rho_l^2}\right]^{1/4} \exp(bH_f\varepsilon_f)$$

wherein $\sigma$ and $\rho_l$ are respectively a surface tension (expressed in N/m) and a density (expressed in kg/m$^3$) of a liquid phase inside the slurry phase reactor, $\rho_V$ is a density (expressed in kg/m$^3$) of a vapour phase inside the slurry phase reactor, $H_f$ and $\epsilon_f$ are a height and a hold-up of a possible foam phase present in an upper zone, and a and b are two parameters to be determined, and
   the transition gas hold-up $\epsilon_{tr}$ obtained by:

$$\varepsilon_{tr} = C\left[\frac{\rho_V^{0.96}\sigma^{0.12}}{\rho_l}\right]^{1/2}(1 - C_1 f_V)\exp(-C_2 U_L)$$

wherein $f_v$ is a volumetric fraction of solid in the slurry phase reactor, $U_L$ is a slurry velocity, C, $C_1$ and $C_2$ are three parameters to be determined, and
   a gas hold-up in the foam phase $\epsilon_f$ being obtained by:

$$\varepsilon_f = \cfrac{1}{1 + \Omega \cfrac{U_L}{U_G}}$$

wherein $\Omega$ is a slip parameter to be determined and $U_G$ is a gas velocity.

3. The method according to claim 1, wherein the gas hold-up of the third zone situated in the upper hemispherical part is not calculated, the weighted average of the gas hold-up of said third zone being considered negligible, due to a volume of said third zone and to a slip velocity equal to zero.

4. The method according to claim 1, wherein the slurry phase reactor is a conversion reactor of heavy residues to distillates or a hydrogenation or hydrodesulfurization or hydrocracking reactor.

5. The method according to claim 1, wherein the slurry phase reactor is a slurry bubble column.

6. The method according to claim 1, wherein the slurry phase reactor comprises at least two nuclear densimeters.

7. The method according to claim 6, wherein the slurry phase reactor comprises three nuclear densimeters positioned at a height between H/4 and H/5, between H/9 and H/11 and between H/6 and H/7 of the slurry phase reactor, H being a "tangent-to-tangent" height of the slurry phase reactor.

8. The method according to claim 6, wherein the slurry phase reactor comprises two nuclear densimeters positioned at a height between H/4 and H/6 and between H/10 and H/5, H being a "tangent-to-tangent" height of the slurry phase reactor.

* * * * *